(12) United States Patent
Berke et al.

(10) Patent No.: US 11,243,586 B2
(45) Date of Patent: Feb. 8, 2022

(54) SYSTEM AND METHOD FOR OPTIMIZING SYSTEM POWER AND PERFORMANCE WITH HIGH POWER MEMORY MODULES

(71) Applicant: DELL PRODUCTS, LP, Round Rock, TX (US)

(72) Inventors: Stuart Allen Berke, Austin, TX (US); Hasnain Shabbir, Round Rock, TX (US)

(73) Assignee: Dell Products L.P., Round Rock, TX (US)

(*) Notice: Subject to any disclaimer, the term of this patent is extended or adjusted under 35 U.S.C. 154(b) by 41 days.

(21) Appl. No.: 16/797,219

(22) Filed: Feb. 21, 2020

(65) Prior Publication Data
US 2021/0263574 A1   Aug. 26, 2021

(51) Int. Cl.
G06F 1/20       (2006.01)
G06F 1/3234     (2019.01)

(52) U.S. Cl.
CPC ............ *G06F 1/206* (2013.01); *G06F 1/3275* (2013.01)

(58) Field of Classification Search
CPC ....................................... G06F 1/206
USPC ........................................ 700/300
See application file for complete search history.

(56) References Cited

U.S. PATENT DOCUMENTS

| 7,233,538 B1* | 6/2007 | Wu ................. G11C 11/406 365/222 |
| 7,768,857 B2* | 8/2010 | Ruckerbauer ......... G11C 11/406 365/222 |
| 2007/0140030 A1* | 6/2007 | Wyatt ................... G11C 5/143 365/212 |
| 2008/0086282 A1 | 4/2008 | Artman et al. |
| 2009/0125695 A1 | 5/2009 | Rangarajan et al. |
| 2010/0191991 A1* | 7/2010 | Berke ................. G11C 11/4074 713/320 |
| 2019/0378564 A1* | 12/2019 | Chang ............... G11C 11/40626 |
| 2020/0258565 A1* | 8/2020 | Schaefer ............. G11C 11/2275 |

FOREIGN PATENT DOCUMENTS

| CN | 1993765 A | * | 7/2007 | ........... G11C 11/406 |
| WO | WO-2004075256 A2 | * | 9/2004 | ............. G11C 29/02 |

* cited by examiner

*Primary Examiner* — Suresh Suryawanshi
(74) *Attorney, Agent, or Firm* — Larson Newman, LLP (57) ABSTRACT

An information handling system includes a processor that runs a maximum memory stress test of a memory module with a refresh rate of memory devices set to a first refresh rate. Then, the processor may receive a power consumption of the memory module. Also, the processor may receive the temperature of the memory devices, and may set the refresh rate to a second refresh rate. The processor may continuously receive both the power consumption of the memory module and the temperature of the memory devices. Based on the continuously received temperature, the processor may determine whether the temperature of the memory devices exceeds a second threshold temperature. If so, the processor may store a first setting as a refresh setting for the memory module. Otherwise, the processor may store a second setting as the refresh setting for the memory module.

20 Claims, 4 Drawing Sheets

SYSTEM AND METHOD FOR OPTIMIZING SYSTEM POWER AND PERFORMANCE WITH HIGH POWER MEMORY MODULES

FIELD OF THE DISCLOSURE

The present disclosure generally relates to information handling systems, and more particularly relates to optimizing system power and performance in an information handling system with high power memory modules.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements may vary between different applications. Thus information handling systems may also vary regarding what information is handled, how the information is handled, how much information is processed, stored, or communicated, and how quickly and efficiently the information may be processed, stored, or communicated. The variations in information handling systems allow information handling systems to be general or configured for a specific user or specific use such as financial transaction processing, airline reservations, enterprise data storage, or global communications. In addition, information handling systems may include a variety of hardware and software resources that may be configured to process, store, and communicate information and may include one or more computer systems, graphics interface systems, data storage systems, networking systems, and mobile communication systems. Information handling systems may also implement various virtualized architectures. Data and voice communications among information handling systems may be via networks that are wired, wireless, or some combination.

SUMMARY

An information handling system includes a memory module having memory devices and thermal sensors. A processor may run a maximum memory stress test of the memory module with a refresh rate of the memory devices set to a first refresh rate. In response to a temperature of the memory devices being substantially equal to a first threshold temperature, the processor may receive a power consumption of the memory module. The processor may receive, from the thermal sensors, the temperature of the memory devices within the memory module, and may set the refresh rate of the memory devices to a second refresh rate. In response to the refresh rate being set to the second refresh rate, the processor may continuously receive the power consumption of the memory module, and continuously receive, from the thermal sensors, the temperature of the memory devices within the memory module. Based on the continuously received temperature of the memory devices, the processor may determine whether the temperature of the memory devices exceeds a second threshold temperature. In response to the temperature of the memory devices exceeding the second threshold temperature, the processor may store a first setting as a refresh setting for the memory module. The first setting only supports the first refresh rate by the memory module. Otherwise and in response to a predetermined amount of time expiring, the processor may store a second setting as the refresh setting for the memory module. The second setting supports both the first and second refresh rates by the memory module.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
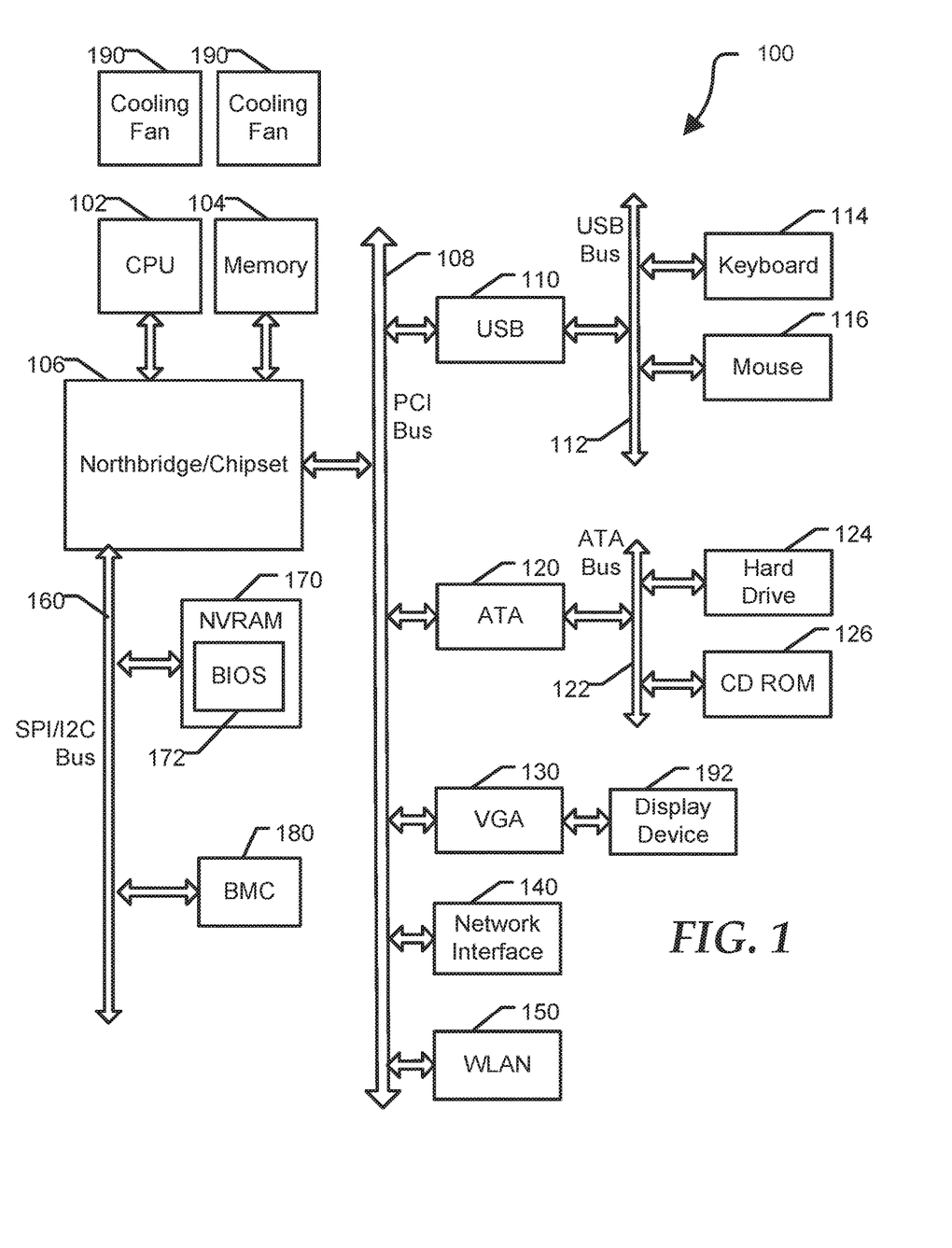
FIG. 1 is a block diagram of a general information handling system according to at least one embodiment of the disclosure.

FIG. 1 illustrates a general information handling system 100 including a processor 102, a memory 104, a northbridge/chipset 106, a PCI bus 108, a universal serial bus (USB) controller 110, a USB bus 112, a keyboard device controller 114, a mouse device controller 116, a configuration an ATA bus controller 120, an ATA bus 122, a hard drive device controller 124, a compact disk read only memory (CD ROM) device controller 126, a video graphics array (VGA) device controller 130, a network interface controller (NIC) 140, a wireless local area network (WLAN) controller 150, a serial peripheral interface (SPI) bus 160, a NVRAM 170 for storing BIOS 172, a baseboard management controller (BMC) 180, and one or more cooling fans 190. In an embodiment, information handling system 100 may be information handling system 200 of FIG. 2. BMC 180 can be referred to as a service processor or embedded controller (EC). Capabilities and functions provided by BMC 180 can vary considerably based on the type of information handling system. For example, the term baseboard management system is often used to describe an embedded processor included at a server, while an embedded controller is more likely to be found in a consumer-level device. As disclosed herein, BMC 180 represents a processing device different from CPU 102, which provides various management functions for information handling system 100. For example, an embedded controller may be responsible for power management, cooling management, and the like. An embedded controller included at a data storage system can be referred to as a storage enclosure processor. Cooling fans 190 may provide air flow to the components within information handling 100.

For purpose of this disclosure information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smart phone, a tablet device or other consumer electronic device, a network server, a network storage device, a switch, a router, or another network communication device, or any other suitable device and may vary in size, shape, performance, functionality, and price. Further, information handling system 100 can include processing resources for executing machine-executable code, such as CPU 102, a programmable logic array (PLA), an embedded device such as a System-on-a-Chip (SoC), or other control logic hardware. Information handling system 100 can also include one or more computer-readable medium for storing machine-executable code, such as software or data.

System 100 can include additional processors that are configured to provide localized or specific control functions, such as a battery management controller. Bus 160 can include one or more busses, including a SPI bus, an I2C bus, a system management bus (SMBUS), a power management bus (PMBUS), and the like. BMC 180 can be configured to provide out-of-band access to devices at information handling system 100. As used herein, out-of-band access herein refers to operations performed prior to execution of BIOS 172 by processor 102 to initialize operation of system 100.

BIOS 172 can be referred to as a firmware image, and the term BIOS is herein used interchangeably with the term firmware image, or simply firmware. BIOS 172 includes instructions executable by CPU 102 to initialize and test the hardware components of system 100, and to load a boot loader or an operating system (OS) from a mass storage device. BIOS 172 additionally provides an abstraction layer for the hardware, such as a consistent way for application programs and operating systems to interact with the keyboard, display, and other input/output devices. When power is first applied to information handling system 100, the system begins a sequence of initialization procedures. During the initialization sequence, also referred to as a boot sequence, components of system 100 are configured and enabled for operation, and device drivers can be installed. Device drivers provide an interface through which other components of the system 100 can communicate with a corresponding device.

Information handling system 100 can include additional components and additional buses, not shown for clarity. For example, system 100 can include multiple processor cores, audio devices, and the like. While a particular arrangement of bus technologies and interconnections is illustrated for the purpose of example, one of ordinary skilled in the art will appreciate that the techniques disclosed herein are applicable to other system architectures. System 100 can include multiple CPUs and redundant bus controllers. One or more components can be integrated together. For example, portions of northbridge/chipset 106 can be integrated within CPU 102. Additional components of information handling system 100 can include one or more storage devices that can store machine-executable code, one or more communications ports for communicating with external devices, and various input and output (I/O) devices, such as a keyboard, a mouse, and a video display. For example, device controller 130 may provide data to a display device 192 to visually present the information to an individual associated with information handling system 100. An example of information handling system 100 includes a multi-tenant chassis system where groups of tenants (users) share a common chassis, and each of the tenants has a unique set of resources assigned to them. The resources can include blade servers of the chassis, input/output (I/O) modules, Peripheral Component Interconnect-Express (PCIe) cards, storage controllers, and the like.

Information handling system 100 can include a set of instructions that can be executed to cause the information handling system to perform any one or more of the methods or computer based functions disclosed herein. The information handling system 100 may operate as a standalone device or may be connected to other computer systems or peripheral devices, such as by a network.

In a networked deployment, the information handling system 100 may operate in the capacity of a server or as a client user computer in a server-client user network environment, or as a peer computer system in a peer-to-peer (or distributed) network environment. The information handling system 100 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 100 can be implemented using electronic devices that provide voice, video or data communication. Further, while a single information handling system 100 is illustrated, the term "system" shall also be taken to include any collection of systems or sub-systems that individually or jointly execute a set, or multiple sets, of instructions to perform one or more computer functions.

The information handling system 100 can include a disk drive unit and may include a computer-readable medium, not shown in FIG. 1, in which one or more sets of instructions, such as software, can be embedded. Further, the instructions may embody one or more of the methods or logic as described herein. In a particular embodiment, the instructions may reside completely, or at least partially, within system memory 104 or another memory included at system 100, and/or within the processor 102 during execution by the information handling system 100. The system memory 104 and the processor 102 also may include computer-readable media.

Figure 2:
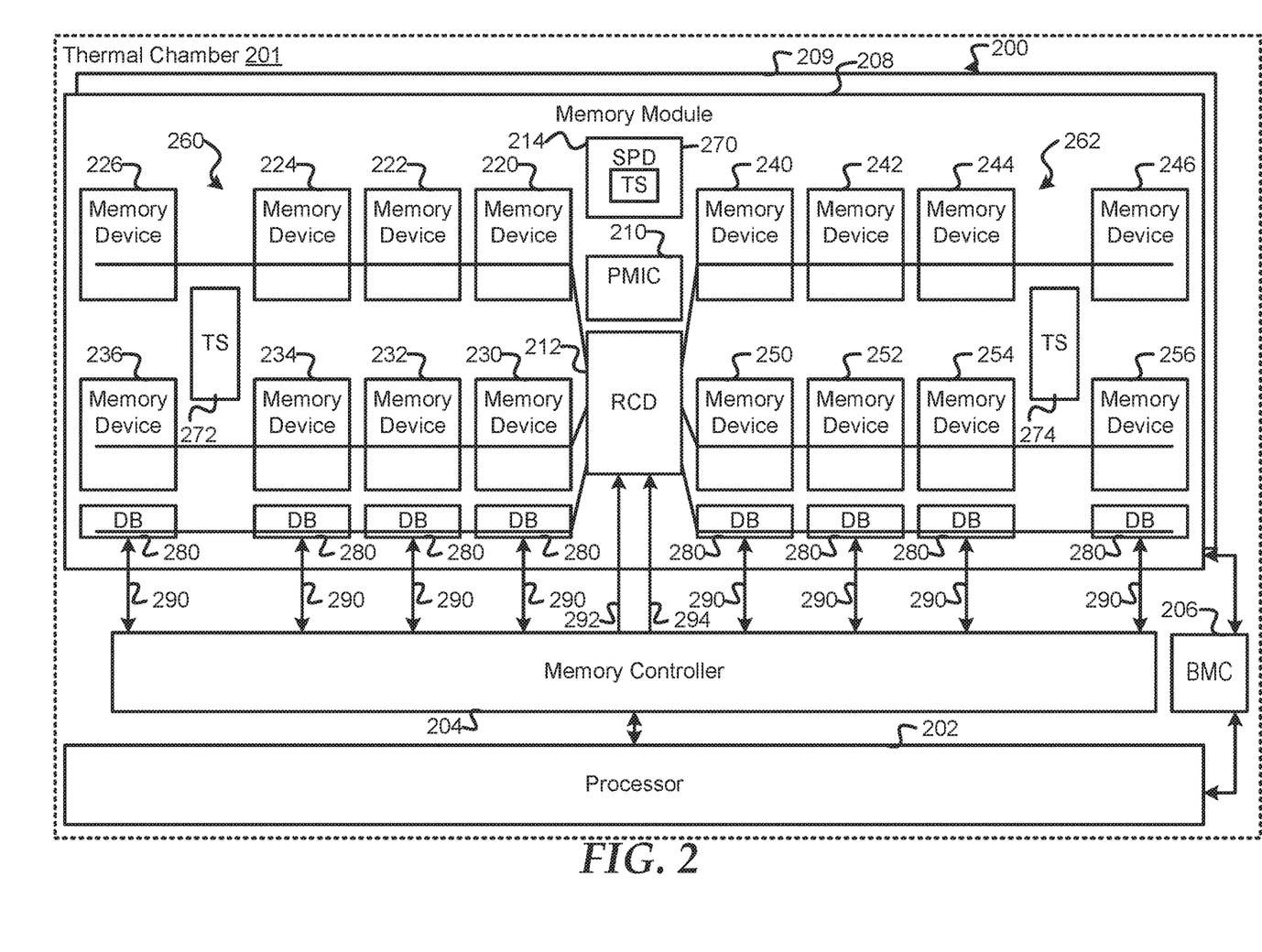
FIG. 2 is a block diagram of a portion of an information handling system according to at least one embodiment of the disclosure.

FIG. 2 illustrates an information handling system 200 including a processor 202, a memory controller 204, a baseboard management controller (BMC) 206, and memory modules 208 and 209 according to at least one embodiment of the disclosure. Memory module 208 includes a power management integrated circuit (PMIC) 210, a registering clock driver (RCD) 212, and an electronically erasable programmable read only memory (EEPROM) serial presence detect (SPD) hub 214. Memory module 208 also includes multiple memory devices including, but not limited to, dynamic random access memories (DRAMs) and non-volatile random access memories (NVRAMs), divided into different independent memory channels and memory ranks. For example, memory devices 220, 222, 224, and 226 (220-226) may be assigned or arranged into a first memory rank of a memory channel 260, and memory devices 230, 232, 234, and 236 (230-236) may be assigned or arranged into a second memory rank of the memory channel 260. Similarly, memory devices 240, 242, 244, and 246 (240-246) may be assigned or arranged into a first memory rank of a memory channel 262, and memory devices 250, 252, 254, and 256 (250-256) may be assigned or arranged into a second memory rank of the memory channel 262. Memory devices 220-226, 230-236, 240-246, and 250-256 on memory module 208 may provide data to memory controller 204, via any suitable manner. For example, memory module 208 may include multiple data bus devices 280 that may communicate with memory controller 204, via any suitable bus, such as one of a plurality of SDRAM buses 290, using a known double data rate (DDR), DDR2, DDR3, DDR4, or DDR5 signaling format. In an example, memory controller 204 may provide command signals to RCD 212 via DDR address buses 292 and 294. Thus, communication between memory controller 204 and memory module 208 may be provided via one or more of communication buses 290, 292, and 294.

Memory module 208 includes multiple thermal sensors including, but not limited to, a thermal sensor 270 within SPD hub 214, a thermal sensor 272 located in the middle of memory channel 260, and a thermal sensor 274 located in the middle of memory channel 262. In an example, memory module 208 may include additional thermal sensors without varying from the scope of this disclosure, such as a different thermal sensor in each memory device, 220-226, 230-236, 240-246, and 250-256, and a thermal sensor in PMIC 210. In an example, thermal telemetry data from thermal sensors 270, 272, and 274 may be provided, via any suitable device and/or operation, to an operating system (OS) executed on processor 202 in communication with memory module 208 via memory controller 204. For example, BMC 206 may receive the thermal telemetry data from thermal sensors 270, 272, and 274 via a side-band communication bus, such as I3C communication bus, and the BMC may provide the thermal telemetry data to processor 202.

In an example, memory module 209 may include any suitable number of components including, but not limited to, substantially similar components to those described for memory module 208. In certain examples, information handling system 200 may include additional components without varying from the scope of the disclosure. For example, information handling system 200 may include additional processors, memory controllers, memory modules, or the like. In an example, the operations of information handling system 200 may be performed with respect to all of memory modules, such as memory modules 208 and 209. However, for brevity and clarity the operations of components within information handling system 200 will be described only with respect to memory module 208.

During operation, processor 202 may access data, such as read or write data, within any of memory module 208 via any suitable manner. For example, processor 202 may communicate with memory controller 204 to access data of memory devices within memory module 208. In an example, memory controller 202 may periodically provide refresh commands to the memory devices within memory module 208 to recharge capacitors within the memory devices.

The refresh commands may be utilized to ensure the proper bit state, such as a 0 or 1, in the bit cells of the memory devices. In an example, a rate of the periodic transmission of the refresh commands may depend on the temperature of the memory device being refreshed. For example, if the temperature of a particular memory device is below a threshold temperature, memory controller 204 may provide the refresh commands to the particular memory device or devices at a first rate, such as a 1× refresh rate. However, if the temperature of a particular memory device exceeds a threshold temperature, memory controller 204 may provide the refresh command to the particular memory device or devices at a second rate, such as a 2× refresh rate. In situations where the refresh rate is the 2× refresh rate, memory controller 204 may utilize the bandwidth available to a memory module to provide the increased number of refresh commands instead of providing read or write commands, such that performance of the memory module may decrease. Additionally, the increased refresh rate for memory devices within memory module 208 may result in higher power consumption within information handling system 200 because of the power utilized to refresh the memory devices in response to each refresh request.

In current memory modules, and in particular memory modules implementing DDR5, an amount of power consumed to refresh memory devices, such as refresh power, may be considerably higher than previous DDR generations. In an example, refresh power within memory module 208 may vary based on one or more of any suitable factors or conditions. For example, refresh power within memory module 208 may be a function of memory device density, a number of ranks per memory module, and operating temperature range. In an example, the memory device density for memory module 208 may be any suitable amount including, but not limited to, 32 Gb, 64 Gb, and 128 Gb. The number of ranks within memory module 208 may include any suitable number including, but not limited to, 2 ranks, 4 ranks, and 8 ranks. In an example, memory module 208 may include any suitable temperature ranges of operations including, but not limited to, a first temperature range below 85° C. and a second temperature range between 85° C. and 95° C.

Prior memory modules have been allowed to operate at temperatures up to the top limit of the second temperature range, such as a second threshold. In an example, the second threshold may be any suitable temperature such as 95° C. However a memory controller, such as memory controller 204, may double the number of refresh commands per second at temperatures at or above the first temperature range, such as a first threshold. In an example, the first threshold may be any suitable temperature such as 85° C. For some memory modules utilizing DDR5, the memory module support setting of a 2× refresh rate may cause sufficient temperature rise on the memory module that a cooling fan, such as cooling fan 190 of FIG. 1, may not be able to maintain the temperature of the memory module at or below 95° C. even at a maximum fan speed with a maximum power consumption of the cooling fan. Additionally, in some situations, the memory module may end up dropping the supportable temperature rating below the first threshold. Historically, it was assumed that running memory modules at higher temperatures, such as above the first threshold, with a 2× refresh rate enabled, is beneficial for system power efficiency. However, with increasing fan power with higher performance fans and dense memory configurations this may not be the case. Thus, processor 202 may improve information handling system 300 by utilizing thermal telemetry data from memory modules, such as memory module 208, power consumption of the memory modules, and power consumption of cooling fans, such as cooling fan 190, to optimize system power and performance in the information handling system including high power memory modules.

In an example, processor 202 may improve information handing system 200 by determining if thermally it is preferable to use a 2× refresh rate at the second threshold, such as 95° C. or the 1× refresh rate at the first threshold, such as 85° C. This determination may be made because a much greater amount of power consumption at the 2× refresh rate may create a more restrictive thermal limit within information handling system 200. In an example, processor 202 may improve information handling system 200 by optimizing for system performance. For example, processor 202 may determine whether the 2× refresh rate requires memory bandwidth throttling, which would negate or worsen the system performance as compared to the 1× refresh rate and no throttling required.

In an example, processor 202 may also improve information handling system 200 by optimizing for system power. For example, processor 202 may dynamically adjust a target temperature for memory modules, such as memory modules 208 and 209, based on whether a fan power reduction benefit out weighs the power increase in the memory modules as a result of implementing the 2× refresh rate. Thus, processor 202 may utilize the operations disclosed herein to optimize system performance or system power, or an advantageous combination.

During a system test of information handling system 200, performance of memory module 208 may be tested at different temperatures, such as a first threshold and a second threshold. In an example, the system test may be performed in any suitable manner under any suitable conditions. For example, information handling system 200 may be tested while placed within a thermal chamber 201, indicated by dashed line in FIG. 2, or while operating in the field.

Upon information handling system 200 being placed in thermal chamber 201 or during operation in the field, processor 202 may perform one or more operations to test whether memory module 208 should support a 2× refresh rate or only a 1× refresh rate of memory devices 220-226, 230-236, 240-246, and 250-256. In an example, processor 202 may run a maximum memory stress test on memory module 208 via any suitable manner. For example, memory stress test may be performed by processor 202 causing memory controller 204 to perform multiple accesses, such as reads or writes, of memory devices 220-226, 230-236, 240-246, and 250-256. In an example, the memory stress test of memory module 208 may cause a memory module to operate at a maximum memory module thermal design power (TDP). In certain examples, a system ambient air temperature may be increased or elevated in any suitable manner until a temperature of memory devices 220-226, 230-236, 240-246, and 250-256 nears a first threshold while the refresh rate of the memory devices is at a first rate, such as 1× refresh rate. In an embodiment, the first threshold is 85° C.

While the temperature of the system ambient air is being increased, power consumption of memory module 208 and the temperature within the memory module may be measured via any suitable device and any suitable manner. For example, BMC 206 may measure or receive the power consumption of memory module 208 by reading registers within PMIC 210. Also, BMC 206 may measure or receive the temperature of memory module 208 by reading thermal data from thermal sensors 270, 272, and 274. In an example, BMC 208 may provide the power consumption and temperature of memory module 206 to processor 202, which in turn may store the data in a memory.

Next, processor 202 may set the refresh rate of memory devices 220-226, 230-236, 240-246, and 250-256 to a second refresh rate, such as a 2× refresh rate, and continuously monitor, via BMC 206, the power consumption and temperature of memory module 208. In an example, processor 208 may determine whether cooling fans, such as cooling fans 190 of FIG. 1, may maintain the temperature of memory devices 220-226, 230-236, 240-246, and 250-256 at a temperature that is below a second threshold, such as 95° C. If processor 208 determines that the temperature of memory module 208 has increased to a temperature above the second threshold, the processor may determine that it is preferable to only support the first refresh rate and keep the temperature of the memory module below the first threshold. For example, processor 202 may determine that memory module 208 may only support 1× refresh rate and that the temperature should be maintained at or below 85° C. This determination may be made in part based on a determination that the second refresh rate, such as a 2× refresh rate, would increase the power consumption of both memory module 208 and cooling fan 190, and would also result in bandwidth throttling within the memory module without any benefit. In an example, processor 202 may determine the bandwidth throttling does not provide any benefit based on throttling the bandwidth to memory devices 220-226, 230-236, 240-246, and 250-256 within memory module 208 to enable the 2× refresh rate but the power consumption of both the memory module and cooling fan 190 may still be high without maintaining the temperature of the memory module below the second threshold. In response to this determination, processor 202 may store a first refresh rate only support setting within SPD hub 214 of memory module 208.

However, if processor 202 determines that a predetermined amount of time has expired and the temperature within memory module 208 remains below the second threshold, the processor may determine that both the first and second refresh rates, such as 1× and 2× refresh rates, may be supported by the memory module. For example, processor 208 may determine the first refresh rate is supported for temperatures below the first threshold, and the second refresh rate is supported for temperatures greater than the first threshold but less than the second threshold. In response to this determination, processor 202 may store both the first and second refresh rates support setting within SPD hub 214 of memory module 208.

In an example, the temperatures for the first and second threshold may be set as thermal guard bands, such as a specific amount below the rated limits of memory module 208, so that the temperatures of memory devices 220-226, 230-236, 240-246, and 250-256 is never above the rated limits. In certain examples, memory controller 204 should be able to throttle the bandwidth of memory module 208 once the system is unable to maintain thresholds, such as 85° C. at a 1× refresh rate or 95° C. at a 2× refresh rate.

In an example, processor 208 may perform the operations disclosed above to test each memory module within information handling system 200 and store the refresh rate support setting for each memory module. In certain examples, processor 208 may perform the test for memory modules on a per memory controller basis, such that each memory module connected to a single memory controller would have the same refresh rate support setting stored in its SPD hub. In another example, processor 208 may perform the test for memory modules on a memory module type basis, such that each memory module of the same type, such as RDIMM, LDIMM, or the like, would have the same refresh rate support setting stored in its SPD hub. In yet another example, processor 208 may perform the test for memory modules on a per memory channel basis, such that each individual memory channel may have a refresh rate support setting stored in the SPD hub of the memory module.

Thus, processor 202 may perform one or more characterizations, utilizing thermal chamber 201 or normal operations, to determine on a memory module type by memory module type basis if it is preferable to enact or support a 2× refresh rate capability or not. In certain examples, processor 202 may perform these operations a priori based on a development characterization of the memory module, in situ based on actual customer configurations, environments, and specific memory module characteristics.

In an example, processor 202 may perform one or more operations to dynamically change a target temperature for memory module 202 to ensure that an amount of power consumption reduction for the memory module is always more than an amount of power consumption increase for cooling fan 190. For example, processor 202 may set different target temperatures for memory module 208 and monitor and record power consumption for both the memory module and cooling fan 190 at the different target temperatures. Processor 202 may utilize the different recorded temperatures to determine which target temperature memory module 208 should have.

During operation, processor 202 may set a target temperature for memory module 208 to a default temperature. In an example, the default temperature may be any suitable temperature including, but not limited to, a maximum operation temperature threshold for memory module 208 and temperature just below the maximum operation temperature threshold. In an embodiment, the maximum operation temperature for memory module 208 is 95° C.

In response to the target temperature being set to the default temperature, processor 208 may perform one or more operations to monitor the power consumption of cooling fan 190 and the power consumption of memory module 208. In an example, BMC 206 may read the power consumption of memory module 208 from one or more registers within PMIC 210, and may provide the power consumption of the memory module to processor 202. Additionally, BMC 206 may read the power consumption of cooling fan 190 from the cooling fan, and provide the power consumption to processor 202. In an embodiment, the baseboard management controller reads the power consumption data via a side-band communication channel, such as an I3C communication channel.

While the target temperature is set to the default temperature and processor 202 is monitoring the power consumption of memory module 208 and cooling fan 190, control logic from the memory module may provide fan speed change requests to the cooling fan. In an example, the memory module fan speed change requests may be based whether the temperatures measure by thermal sensors 270, 272, and 274 are above, equal to, or below the target temperature. For example, if the temperature measured by one or more of thermal sensors 270, 272, and 274 is above the target temperature, control logic of memory module 208 may provide a positive value memory module fan speed change request that requests an increase in fan speed. However, if the temperature measured by one or more of thermal sensors 270, 272, and 274 is substantially equal to the target temperature, control logic of memory module 208 may provide a memory module fan speed change request that is zero so that no change in fan speed is requested. Additionally, if the temperature measured by one or more of thermal sensors 270, 272, and 274 is below the target temperature, control logic of memory module 208 may provide a negative value memory module fan speed change request that requests a decrease in fan speed.

In an example, control logic for other components within information handling system 200 may provide fan speed change requests to cooling fan 190. In this example, the fan speed change requests from the other components may be positive, zero, or negative based on similar temperature readings by thermal sensors associated with the other components.

During the operation of information handling system 200 and while the target temperature is set to the default temperature, processor 202 may monitor the fan speed change requests provided to cooling fan 190 from memory module 208 and any other component within the information handling system. Processor 202 may perform one or more operations based on these fan speed change requests. For example, processor 202 may determine whether the memory module fan speed change request is both equal to zero and the highest request of the fan speed change requests provided to cooling fan 190. In an example, the memory module fan speed change request being equal to zero may indicate that memory module 208 is at the target temperature and not requesting more cooling, but also not requesting a reduction in fan speeds. Additionally, the memory module fan speed change request being equal to zero and also being the highest fan speed change request indicates that other control logic for other components in information handling system 200 are requesting negative fan speed changes or reductions in fan speeds of cooling fan 190. Thus, control logic within memory module 208 may be the driving control logic for fan speed changes and is reaching a steady state.

In response to the memory module fan speed change request being equal to zero and the highest request, processor 202 may record a current power consumption of cooling fan 190 as a first fan power and a current power consumption of memory module 208 as a first memory module power. Then, processor 202 may set the target temperature for memory module 208 to a second temperature that is below the default temperature. In an example, the second temperature may be any suitable temperature including, but not limited to, a temperature below a threshold temperature for refresh rate change. For example, the threshold temperature may be the temperature at which the refresh rate for memory devices 220-226, 230-236, 240-246, and 250-256 changes from a 1× refresh rate to a 2× refresh rate, such as 85° C.

While the target temperature is set to the second temperature, processor 202 may continue to monitor the power consumption of cooling fan 190 and the power consumption of memory module 208. Processor 202 may also continue to monitor the fan speed change requests as discussed above. Based on the monitoring, processor 202 may determine whether the memory module fan speed change request is again both equal to zero and the highest request of the fan speed change requests provided to cooling fan 190. In response to the memory module fan speed change request being both equal to zero and the highest request, processor 202 may record a current power consumption of cooling fan 190 as a second fan power and the current power consumption of memory module 208 as a second memory module power.

Based on the first and second memory module powers, processor 202 may calculate a power consumption decrease for memory module 208 by subtracting the second memory module power from the first memory module power. Similarly, based on the first and second fan powers, processor 202 may calculate a power consumption increase for cooling fan 190 by subtracting the first fan power from the second fan power. In an example, running memory module 208 with the target temperature set at the second temperature, such as a lower target temperature, may reduce the power consumption of the memory module based on the refresh rate of memory devices 220-226, 230-236, 240-246, and 250-256 being at a lower rate as compared to when the target temperature is set at the default temperature, such as the higher temperature. However, running memory module 208 with the target temperature set at the second temperature may increase the power consumption of cooling fan 190 based on the cooling fan running at a higher rate to provide sufficient air flow to keep the temperature of the memory module at the second temperature which is less than the default temperature. Processor 202 may determine whether the power consumption decrease for memory module 208 is less than the power consumption increase of cooling fan 190.

In response to the power consumption decrease for memory module 208 being less than the power consumption increase for cooling fan 190, processor 202 may determine that system power may be optimized when the target temperature for memory module 208 is set to the default temperature, such as 95° C. Thus, processor 202 may change the target temperature for memory module 208 from the second temperature to the default temperature. However, if processor 202 determines that the power consumption decrease for memory module 208 is greater than the power consumption increase for cooling fan 190, the processor may determine that system power may be optimized when the target temperature for the memory module is set to the second temperature, such as 85° C. In this situation, processor 202 may keep the target temperature for memory module 208 at the second temperature.

Thus, processor 202 may improve information handling system 200 by making dynamic adjustments to the target temperature for memory module 208 without the need for any prior characterization of the memory module. Additionally, the operations of processor 202 may automatically account for different system configurations in different memory modules. In an example, processor 202 may utilize a unique control logic control checkpoint to deduce multiple thermal states. These different thermal states may include, but are not limited to, the memory module fan speed request change being zero but still being the highest request, which means all other thermal sensors in information handling system 200 are well below their target temperatures and are requesting a negative fan speed adjustment. Processor 202 may make these determinations without any suitable characteristics including, but not limited to, memory module workload nature and memory module type. In an example, processor 202 may determine that if the memory module fan speed request change is not dominant, it means another thermal sensor is driving the fan speed change request and the processor does not need to optimize the target temperature of memory module 208 at that point.

Figure 3:
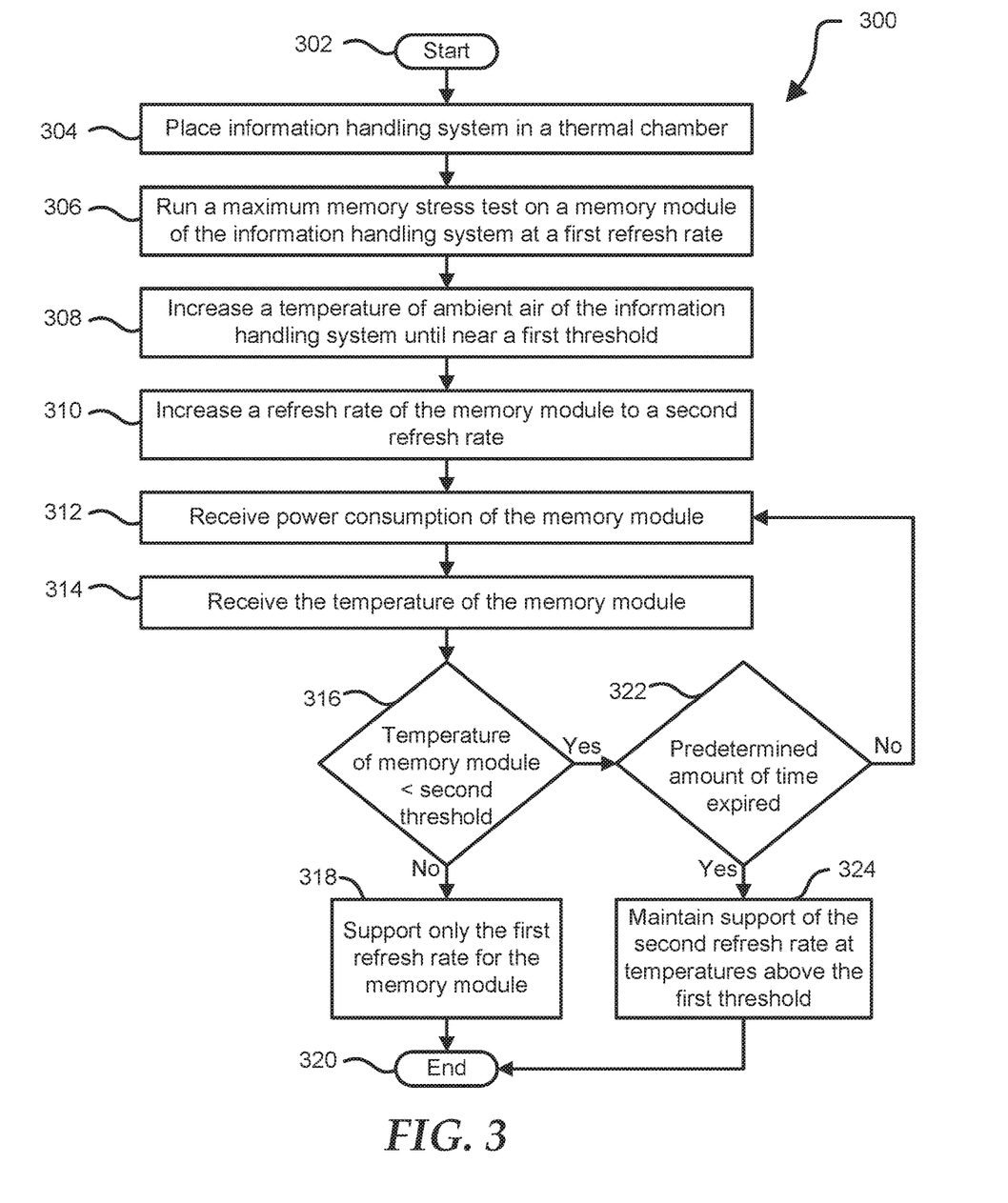
FIG. 3 is a flow diagram illustrating a method for optimizing system performance while utilizing high power memory modules according to at least one embodiment of the disclosure.

FIG. 3 is a flow diagram illustrating a method 300 for optimizing system performance while utilizing high power memory modules according to at least one embodiment of the disclosure, starting at block 302. It will be readily appreciated that not every method step set forth in this flow diagram is always necessary, and that certain steps of the methods may be combined, performed simultaneously, in a different order, or perhaps omitted, without varying from the scope of the disclosure. FIG. 3 may be employed in whole, or in part, by information handling system 100 depicted in FIG. 1, information handling system 200 described in FIG. 2, or any other type of system, controller, device, module, processor, or any combination thereof, operable to employ all, or portions of, the method of FIG. 3.

At block 304, an information handling system is placed in a thermal chamber. In an example, the thermal chamber may be replaced with a typical operating environment without varying from the scope of the disclosure. In certain examples, the information handling system may be placed under a product or system test during the operations of FIG. 3.

At block 306, a maximum memory stress test is run on a memory module of the information handling system. In an example, the maximum memory stress test may include accessing memory devices of the memory module at a high bandwidth. Additionally, at the beginning of the memory stress test a refresh rate of the memory devices may be set to a first refresh rate. In an embodiment, the first refresh rate is a 1× refresh rate. In an example, the memory devices may be any suitable device including, but not limited to, a non-volatile random access memories (NVRAMs) and dynamic random access memories (DRAMs). In certain examples, the memory module may include multiple memory ranks, and multiple memory channels.

At block 308, a temperature of ambient air within the information handling system is increased. In an example, the increase in the temperature of the ambient air may increase the temperature of the memory devices within the memory module. In an embodiment, the temperature of the ambient air is increased until the temperature of the memory devices is substantially near a first threshold temperature. In an example, the first threshold temperature may be any suitable temperate at which the refresh rate of the memory devices is changed from the first refresh rate to a second refresh rate.

At block 310, the refresh rate of the memory devices of the memory module is increased to the second refresh rate. In an example, the second refresh rate may be any suitable rate including, but not limited to, a 2× refresh rate. At block 312, a power consumption of the memory module is received. In an example, a power management integrated circuit of the memory module may store the power consumption of the memory module. At block 314, the temperature of the memory devices within the memory module is received. The temperature of the memory devices may be measured by a plurality of thermal sensors within the memory module. In an example, the thermal sensors may be located in any suitable location including, but not limited to, within a SPD hub in the center of the memory modules, and in the middle of each memory channel of the memory module. In an example, the temperatures may be read by any suitable device including, but not limited to, a baseboard management controller and a memory controller. In an embodiment, the baseboard management controller reads the thermal telemetry data via a side-band communication channel, such as an I3C communication channel. The baseboard management controller may then provide the temperatures to a processor of the information handling system.

At block 316, a determination is made whether the temperature of the memory devices within the memory module remains less than a second threshold temperature. In an example, the second threshold temperature may be any suitable temperature, at which, the memory module is rated to remain below. If the temperature of the memory modules does not remain below the second threshold temperature, a setting of the memory module is set to only support the first refresh rate, and the method ends at block 320.

Otherwise, if the temperature of the memory module remains below the second threshold temperature, a determination is made whether a predetermined amount of time has expired at block 322. If the predetermined amount of time has not expired, the flow continues as stated above at block 312. If the predetermined amount of time has expired, a setting of the memory module is set to support both the first and second refresh rates at block 324, and the method ends at block 320.

Figure 4:
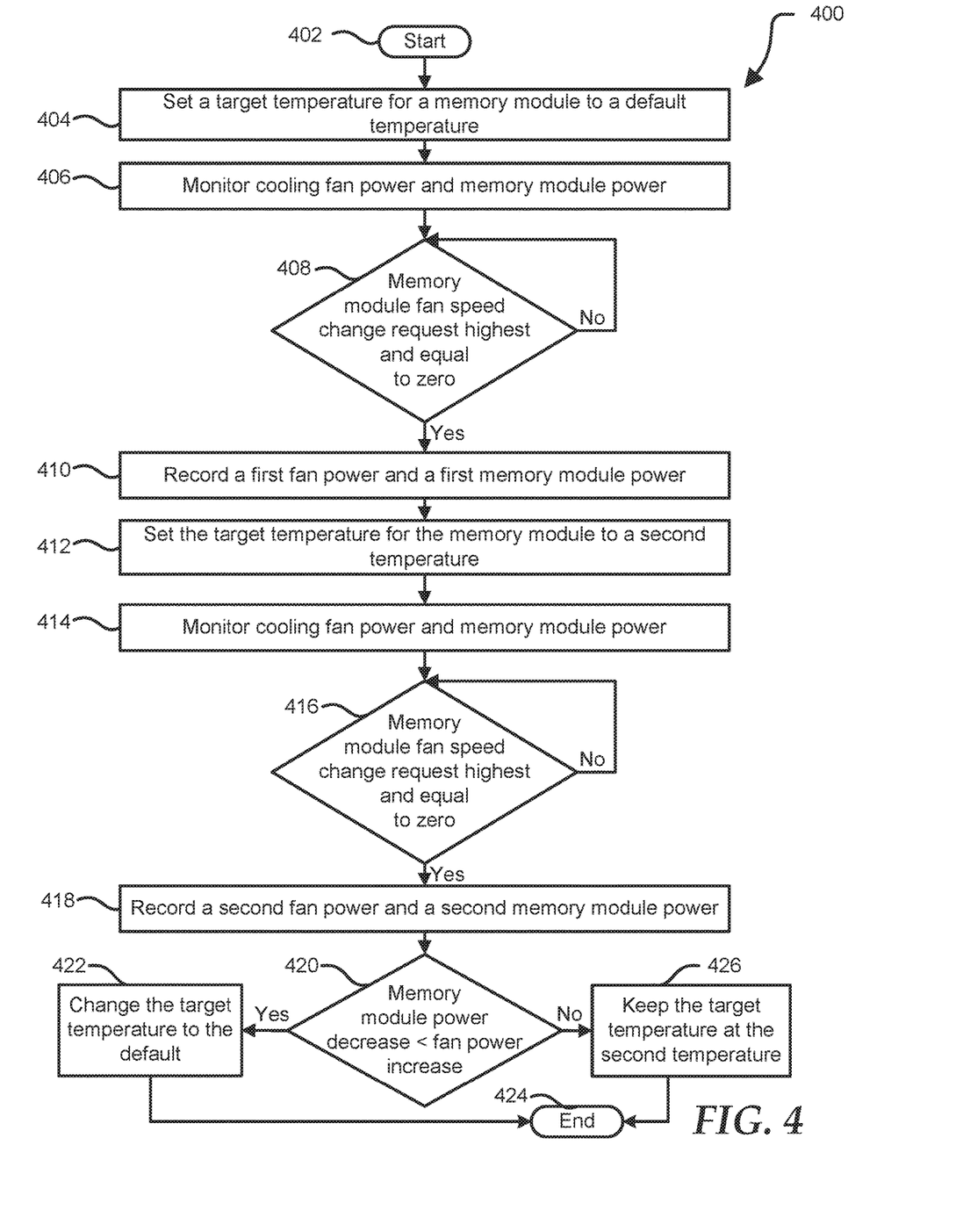
FIG. 4 is a flow diagram illustrating a method for optimizing system power while utilizing high power memory modules according to at least one embodiment of the disclosure.

FIG. 4 shows a method 400 for optimizing system power while utilizing high power memory modules according to at least one embodiment of the disclosure, starting at block 402. It will be readily appreciated that not every method step set forth in this flow diagram is always necessary, and that certain steps of the methods may be combined, performed simultaneously, in a different order, or perhaps omitted, without varying from the scope of the disclosure. FIG. 4 may be employed in whole, or in part, by information handling system 100 depicted in FIG. 1, information handling system 200 described in FIG. 2, or any other type of system, controller, device, module, processor, or any combination thereof, operable to employ all, or portions of, the method of FIG. 4. In an example, the operations of method 400 may be performed during the normal operations of an information handling system.

At block 404, a target temperature for a memory module is set to a default temperature. In an example, the default temperature may be any suitable temperature including, but not limited to, a maximum operation temperature threshold for the memory module. The memory module may include any number of memory devices. In an example, the memory devices may be any suitable device including, but not limited to, a non-volatile random access memories (NVRAMs) and dynamic random access memories (DRAMs). In certain examples, the memory module may include multiple memory ranks including the first memory rank.

At block 406, power consumption of a cooling fan and power consumption of the memory module are monitored. In an example, a power management integrated circuit of the memory module may store the power consumption of the memory module. In an example, the power consumptions may be read by any suitable device including, but not limited to, a baseboard management controller and a memory controller. In an embodiment, the baseboard management controller reads the power consumption data via a side-band communication channel, such as an I3C communication channel. The baseboard management controller may then provide the power consumptions to a processor of the information handling system. In an example, the baseboard management controller may also read one or more temperatures of the memory module. In an example, the memory module may include any suitable number of thermal sensors, and the thermal sensors may be located at any suitable location within the memory module. For example, the thermal sensors may be located in a SPD hub in the center of the memory modules, in the middle of each memory channel of the memory module, or the like.

At block 408, a determination is made whether a memory module fan speed change request is both equal to zero and the highest request of the fan speed change requests provided to the cooling fan. In an example, the memory module fan speed change request being equal to zero indicates that the memory module is at the target temperature and not requesting more cooling, but also not requesting a reduction in fan speeds. Additionally, the memory module fan speed change request being equal to zero and also being the highest fan speed change request indicates that other control logic for other components in the information handling system are requesting negative fan speed changes or reductions in fan speeds. Thus, the control logic in the memory module is the driving control logic for fan speed changes and is reaching a steady state.

In response to the memory module fan speed change request being equal to zero and the highest request, a first fan power and a first memory module power are recorded at block 410. At block 412, the target temperature for the memory module is set to a second temperature below the default temperature. In an example, the second temperature may be any suitable temperature including, but not limited to, a temperature below a threshold temperature for refresh rate change. In certain examples, the refresh rate change may be any suitable change including, but not limited to, from a 1× refresh rate to a 2× refresh rate.

At block 414, power consumption of a cooling fan and power consumption of the memory module are monitored. At block 416, a determination is made whether a memory module fan speed change request is equal to zero and is the highest request of one or more fan speed change requests provided to the cooling fan. In an example, the determination of block 416 is made while the target temperature is at the second temperature.

In response to the memory module fan speed change request is equal to zero and is the highest request, a second fan power and a second memory module power are recorded at block 418. At block 420, a determination of whether a power consumption decrease for the memory module is less than a power consumption increase of the cooling fan. In an example, running the memory module with the target temperature set at the second temperature may reduce the power consumption of the memory module based on the refresh rate of the memory devices being at a lower rate as compared to when the target temperature is set at the default temperature. However, running the memory module with the target temperature set at the second temperature may increase the power consumption of the cooling fan based on the cooling fan running at a higher rate to provide sufficient air flow to keep the temperature of the memory module at the second temperature which is less than the default temperature. In an example, the power consumption decrease for the memory module may be calculated by subtracting the second memory module power from the first memory module power, and the power consumption increase for the cooling fan may be calculated by subtracting the first fan power from the second fan power.

In response to the power consumption decrease for the memory module being less than the power consumption increase for the cooling fan, the target temperature for the memory module is changed to the default temperature at block 422, and the method ends at block 424. However, if the power consumption decrease for the memory module is greater than the power consumption increase for the cooling fan, the target temperature for the memory module is kept at the second temperature at block 426, and the method ends at block 424.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium may include a solid-state memory such as a memory card or other package that houses one or more non-volatile read-only memories. Further, the computer-readable medium may be a random access memory or other volatile re-writable memory. Additionally, the computer-readable medium may include a magneto-optical or optical medium, such as a disk or tapes or other storage device to store information received via carrier wave signals such as a signal communicated over a transmission medium. Furthermore, a computer readable medium may store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

When referred to as a "device," a "module," or the like, the embodiments described herein may be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module may include software, including firmware embedded at a processor or software capable of operating a relevant environment of the information handling system. The device or module may also include a combination of the foregoing examples of hardware or software. Note that an information handling system may include an integrated circuit or a board-level product having portions thereof that may also be any combination of hardware and software.

Devices, modules, resources, or programs that are in communication with one another need not be in continuous communication with each other, unless expressly specified otherwise. In addition, devices, modules, resources, or programs that are in communication with one another may communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An information handling system, comprising:
a memory module including:
   a plurality of memory devices; and
   a plurality of thermal sensors; and
a processor to communicate with the memory module and with a cooling fan, the processor to:
   run a maximum memory stress test of the memory module with a refresh rate of the plurality of memory devices set to a first refresh rate;
   in response to a temperature of the plurality of memory devices being substantially equal to a first threshold temperature, the processor to:
      receive a power consumption of the memory module;
      receive, from the plurality of thermal sensors, the temperature of the plurality of memory devices within the memory module; and
      set the refresh rate of the plurality of memory devices to a second refresh rate;
   in response to the refresh rate being set to the second refresh rate, the processor to:
      continuously receive the power consumption of the memory module;
      continuously receive, from the plurality of thermal sensors, the temperature of the plurality of memory devices within the memory module;
      based on the continuously received temperature of the plurality of memory devices, determine whether the temperature of the plurality of memory devices exceeds a second threshold temperature;
      in response to the temperature of the plurality of memory devices exceeding the second threshold temperature, the processor to store a first setting as a refresh setting for the memory module, wherein the first setting only supports the first refresh rate by the memory module; and
      otherwise, in response to a predetermined amount of time expiring, the processor to store a second setting as the refresh setting for the memory module, wherein the second setting supports both the first and second refresh rates by the memory module.

2. The information handling system of claim 1, wherein the temperature of the memory module is increased in response to an ambient air temperature of the information handling system being elevated.

3. The information handling system of claim 2, further comprising:
a baseboard management controller to communicate with the memory module and with the processor, the baseboard management controller to read the power consumption of the memory module from a plurality of registers within a power management integrated circuit of the memory module, and to provide the power consumption of the memory module to the processor.

4. The information handling system of claim 1, further comprising:
a cooling fan to provide air flow across the plurality of memory devices of the memory module, wherein both an amount of air flow provided and a power consumption of the cooling fan increase in response to an increase in the temperature of the plurality of memory devices.

5. The information handling system of claim 1, in response to the temperature of the plurality of memory devices exceeding the second threshold temperature, the processor further to determine that the power consumption of the memory module increases, a power consumption of the cooling fan increases, and bandwidth throttling of the memory module is performed without a benefit to the information handling system.

6. An information handling system, comprising:
a memory module including a plurality of memory devices;
a cooling fan to provide air flow across the plurality of memory devices of the memory module; and
a processor to:
set a target temperature for the plurality of memory devices to a default target temperature, wherein a memory module fan speed change request for the cooling fan is generated based on a current temperature of the plurality of memory devices within the memory module and the target temperature;
continuously receive a power consumption of the cooling fan and a power consumption of the memory module;
determine whether the memory module fan speed change request is zero and a highest fan speed change request;
in response to the memory module fan speed change request being zero and the highest fan speed change request, the processor to:
store a current power consumption of the cooling fan as a first power consumption;
store a current power consumption of the memory module as a second power consumption;
set the target temperature for the plurality of memory devices to a second target temperature;
continuously receive the power consumption of the cooling fan and the power consumption of the memory module; and
determine whether the memory module fan speed change request is zero and the highest fan speed change request while the target temperature is set to the second temperature; and
in response to the memory module fan speed change request being zero and the highest fan speed change request while the target temperature is set to the second temperature, the processor to:
store the current power consumption of the cooling fan as a third power consumption;
store the current power consumption of the memory module as a fourth power consumption;
determine whether a first difference between the first power consumption and the third power consumption is less than a second difference between the fourth power consumption and the second power consumption;
in response to the first difference being less than the second difference, the processor to set the target temperature to the default temperature; and
in response to the first difference being greater than the second difference, the processor to set the target temperature to the second temperature.

7. The information handling system of claim 6, wherein the memory module further includes:
a power management integrated circuit including a plurality of registers to store the power consumption of the memory module.

8. The information handling system of claim 7, further comprising:
a baseboard management controller to communicate with the memory module and with the processor, the baseboard management controller to read the power consumption of the memory module from the registers of the power management integrated circuit, and to provide the power consumption of the memory module to the processor.

9. The information handling system of claim 6, further comprising:
a memory controller to communicate with the plurality of memory devices, the memory controller to provide refresh commands to the plurality of memory devices at a first refresh rate while a temperature of the plurality of memory devices is at below a threshold temperature, and to provide the refresh commands to the plurality of memory devices at a second refresh rate while the temperature of the plurality of memory devices is above the threshold temperature, wherein the threshold temperature is substantially in the middle of a temperature range between the second temperature and the default temperature.

10. The information handling system of claim 6 wherein in response to the first difference is less than the second difference, the processor to determine that the information handling system uses less power when the target temperature is set to the default temperature.

11. The information handling system of claim 6 wherein in response to the first difference being greater than the second difference, the processor to determine that the information handling system uses less power when the target temperature is set to the second temperature.

12. The information handling system of claim 6, wherein the memory module fan speed change request being zero indicates that the memory module is at the target temperature and not requesting for additional air flow from the cooling fan.

13. The information handling system of claim 6, wherein the memory module fan speed change request being the highest fan speed change request indicates that the memory module fan speed change request is a controlling request out a plurality of fan speed change requests within the information handling system.

14. A method, comprising:
setting, by a processor of an information handling system, a target temperature to a default target temperature, wherein the target temperature is for a plurality of memory devices of a memory module of the information handling system, wherein a memory module fan speed change request for a cooling fan is generated based on a current temperature of the plurality of memory devices within the memory module and the target temperature;
continuously receiving, by the processor, a power consumption of the cooling fan and a power consumption of the memory module;
determining whether the memory module fan speed change request is zero and a highest fan speed change request;
in response to the memory module fan speed change request being zero and the highest fan speed change request:
storing a current power consumption of the cooling fan as a first power consumption;
storing a current power consumption of the memory module as a second power consumption;
setting the target temperature for the plurality of memory devices to a second target temperature;

continuously receiving the power consumption of the cooling fan and the power consumption of the memory module; and determining whether the memory module fan speed change request is zero and the highest fan speed change request while the target temperature is set to the second temperature; and in response to the memory module fan speed change request being zero and the highest fan speed change request while the target temperature is set to the second temperature:

storing the current power consumption of the cooling fan as a third power consumption;

storing the current power consumption of the memory module as a fourth power consumption;

determining whether a first difference between the first power consumption and the third power consumption is less than a second difference between the fourth power consumption and the second power consumption;

in response to the first difference being less than the second difference, setting the target temperature to the default temperature; and in response to the first difference being greater than the second difference, setting the target temperature to the second temperature.

15. The method of claim 14, further comprising:

reading, by a baseboard management controller, the power consumption of the memory module from a plurality of registers of a power management integrated circuit within the memory module; and providing the power consumption of the memory module to the processor.

16. The method of claim 14, further comprising:

providing, by a memory controller, refresh commands to the plurality of memory devices at a first refresh rate while a temperature of the plurality of memory devices is at below a threshold temperature; and providing, by a memory controller, the refresh commands to the plurality of memory devices at a second refresh rate while the temperature of the plurality of memory devices is above the threshold temperature, wherein the threshold temperature is substantially in the middle of a temperature range between the second temperature and the default temperature.

17. The method of claim 14, further comprising:

in response to the first difference is less than the second difference, determining, by the processor, that the information handling system uses less power when the target temperature is set to the default temperature.

18. The method of claim 14, further comprising:

in response to the first difference being greater than the second difference, determining, by the processor, that the information handling system uses less power when the target temperature is set to the second temperature.

19. The method of claim 14, wherein the memory module fan speed change request being zero indicates that the memory module is at the target temperature and not requesting for additional air flow from the cooling fan.

20. The method of claim 14, wherein the memory module fan speed change request being the highest fan speed change request indicates that the memory module fan speed change request is a controlling request out a plurality of fan speed change requests within the information handling system.

* * * * *